United States Patent
Min et al.

(10) Patent No.: US 7,144,784 B2
(45) Date of Patent: Dec. 5, 2006

(54) METHOD OF FORMING A SEMICONDUCTOR DEVICE AND STRUCTURE THEREOF

(75) Inventors: Byoung W. Min, Austin, TX (US); Nigel G. Cave, Austin, TX (US); Venkat R. Kolagunta, Austin, TX (US); Omar Zia, Austin, TX (US); Sinan Goktepeli, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 119 days.

(21) Appl. No.: 10/902,218

(22) Filed: Jul. 29, 2004

(65) Prior Publication Data

US 2006/0024893 A1 Feb. 2, 2006

(51) Int. Cl.
*H01L 21/336* (2006.01)
*H01L 21/8242* (2006.01)
*H01L 21/3205* (2006.01)

(52) U.S. Cl. .................. 438/287; 438/287; 438/239; 438/240; 438/591; 257/E21.177

(58) Field of Classification Search ................ 438/287, 438/239, 240, 591
See application file for complete search history.

(56) References Cited

U.S. PATENT DOCUMENTS

| 4,324,038 | A * | 4/1982 | Chang et al. ............. 438/282 |
| 6,919,244 | B1 * | 7/2005 | Remmel et al. ........... 438/239 |
| 2004/0026731 | A1 | 2/2004 | Clevenger et al. |
| 2004/0032001 | A1 | 2/2004 | Gilmer et al. |

OTHER PUBLICATIONS

S.B. Samavedam, et al., "Dual-Metal Gate CMOS with HIO₂ Gate Dielectric," Digital DNA Laboratories, 3501 Ed Bluestein Blvd., Texas 78721, USA.
Related U.S. Appl. No. 10/876,820 filed Jun. 25, 2004.
Related U.S. Appl. No. 10/400,896 filed Mar. 27, 2003.
Related U.S. Appl. No. 10/209,523 filed Jul. 31, 2002.

* cited by examiner

*Primary Examiner*—Michael Lebentritt
*Assistant Examiner*—Mohsen Ahmadi
(74) *Attorney, Agent, or Firm*—Kim-Marie Vo

(57) ABSTRACT

In one embodiment, a method for forming a semiconductor device is described. A semiconductor substrate has a first portion and a second portion. A first dielectric layer formed over the first portion of the semiconductor substrate and a second dielectric layer is formed over the second portion of the semiconductor substrate. A cap that may include silicon, such as polysilicon, is formed over the first dielectric layer. A first electrode layer is formed over the cap and a second electrode layer is formed over the second dielectric.

21 Claims, 8 Drawing Sheets

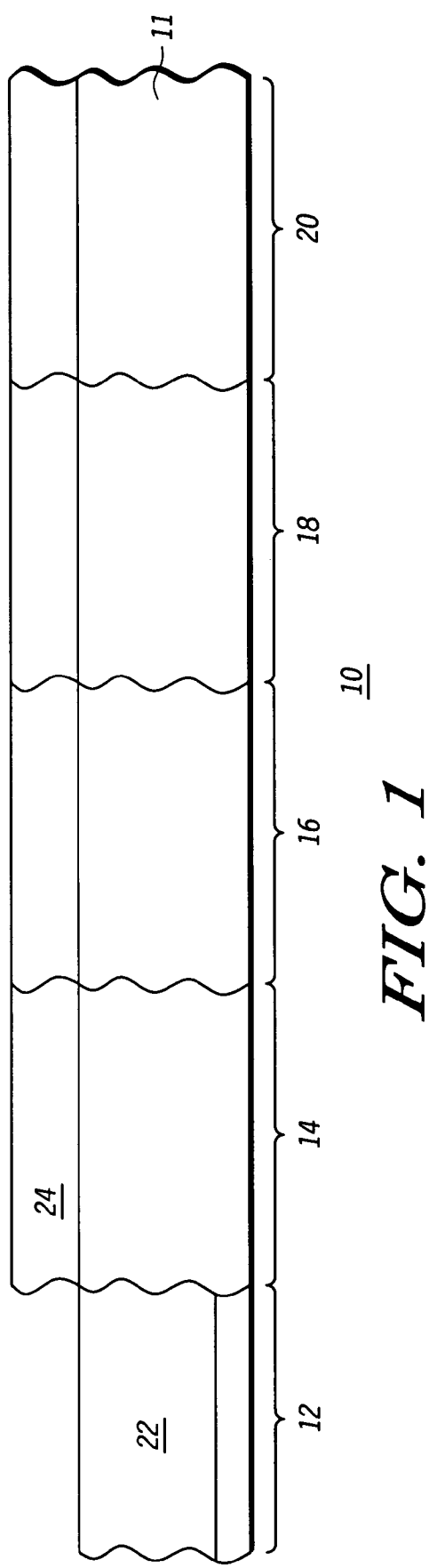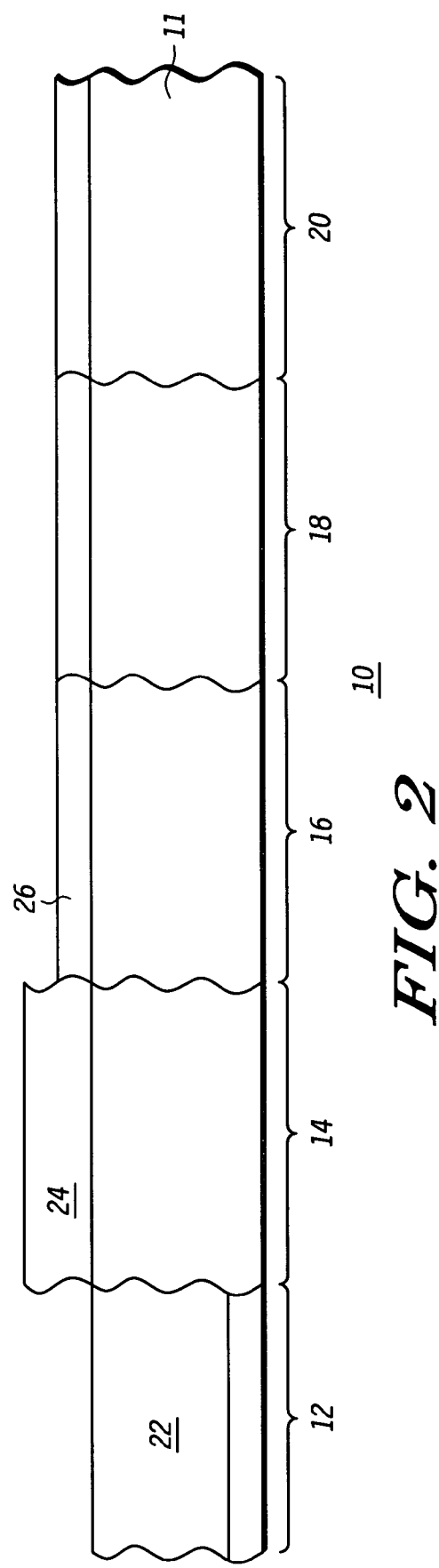

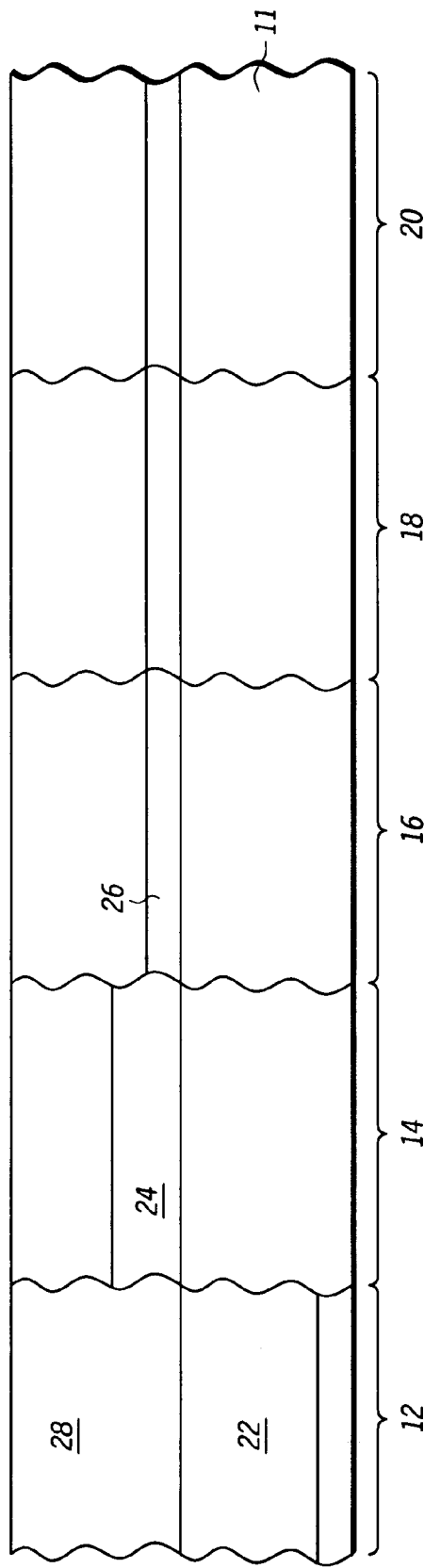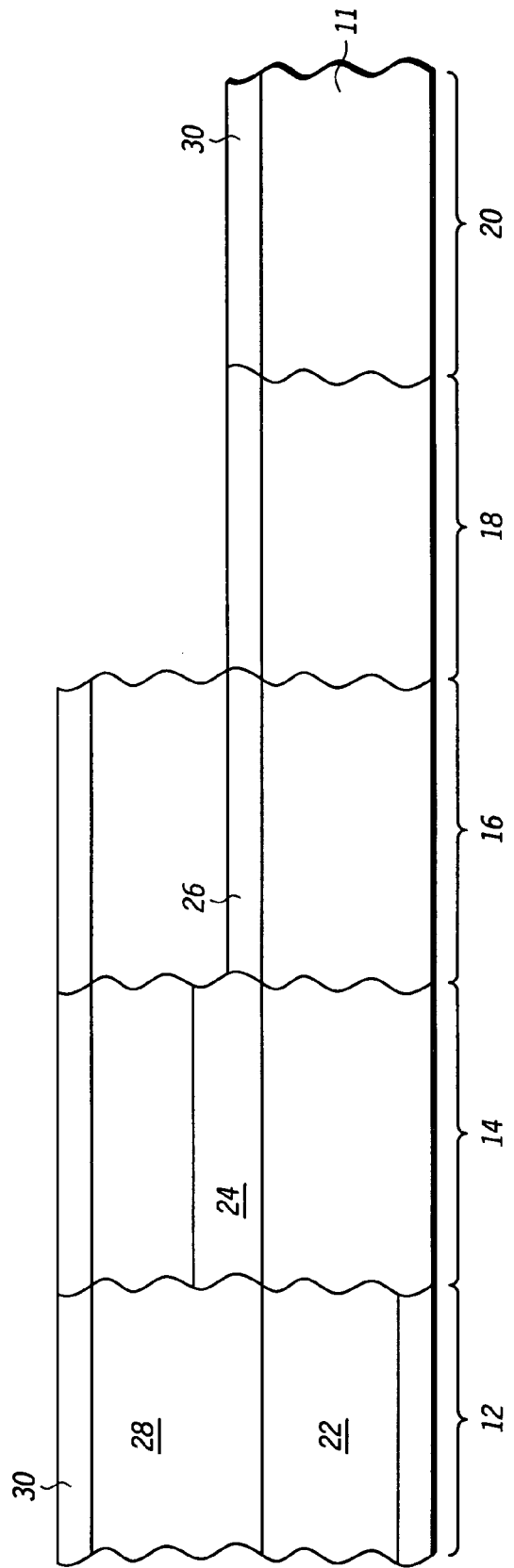

US 7,144,784 B2

METHOD OF FORMING A SEMICONDUCTOR DEVICE AND STRUCTURE THEREOF

FIELD OF THE INVENTION

This invention relates generally to forming semiconductor devices, and more specifically, to forming high-voltage devices.

BACKGROUND

As device dimensions shrink, high dielectric constant (high-k or hi-k) materials are being used as the gate dielectric for devices operating at the lowest voltages in the circuit, henceforth referred to as core devices. But at least three problems exist if a high-k material, such as $HfO_2$ (hafnium oxide), is used for high voltage devices, such as an intermediate thickness gate oxide devices (henceforth known as TGO devices), a thicker gate oxide devices (henceforth known as DGO devices), or capacitors. First, if $HfO_2$ is formed over $SiO_2$ (silicon dioxide), the Hf (hafnium) and Hf-induced defects may diffuse into the $SiO_2$ during manufacturing. The diffusion will cause poor reliability, especially in high voltage applications. Second, using a high-k material changes the work function of the device. When the work function changes, the technology associated with the device must be altered. Instead, by not changing to a high-k material, the earlier technology can continue to be used and time is saved having to develop any new technology. Third, it is unknown if any effects due to interaction between the high-k material and the other materials at the edge of the patterned gate are created when using $HfO_2$ in a high voltage device. Thus, it is desirable to not use high-k materials for some semiconductor devices, such as high voltage devices.

It is often desirable that both core devices and high voltage devices are formed on the same semiconductor substrate. When forming the high-k material for the core devices, it is desirable to prevent the high-k material from being formed as part of a gate stack for the high voltage devices. Thus, there is a need for an integration process that enables the different dielectrics to be formed in different areas of the substrate.

BRIEF DESCRIPTION OF THE DRAWINGS

The present invention is illustrated by way of example and is not limited by the accompanying figures, in which like references indicate similar elements.

FIG. 1 illustrates a cross-section of a portion of a semiconductor device having a passive device region, high voltage device regions and core device regions, a first dielectric layer, and a second dielectric layer in accordance with an embodiment of the present invention;

FIG. 2 illustrates the semiconductor device of FIG. 1 after forming a third dielectric layer over a high voltage device region and the core device regions in accordance with an embodiment of the present invention;

FIG. 3 illustrates the semiconductor device of FIG. 2 after forming a cap in accordance with an embodiment of the present invention;

FIG. 4 illustrates the semiconductor device of FIG. 3 after forming a fourth dielectric layer in accordance with an embodiment of the present invention;

Figure 5:
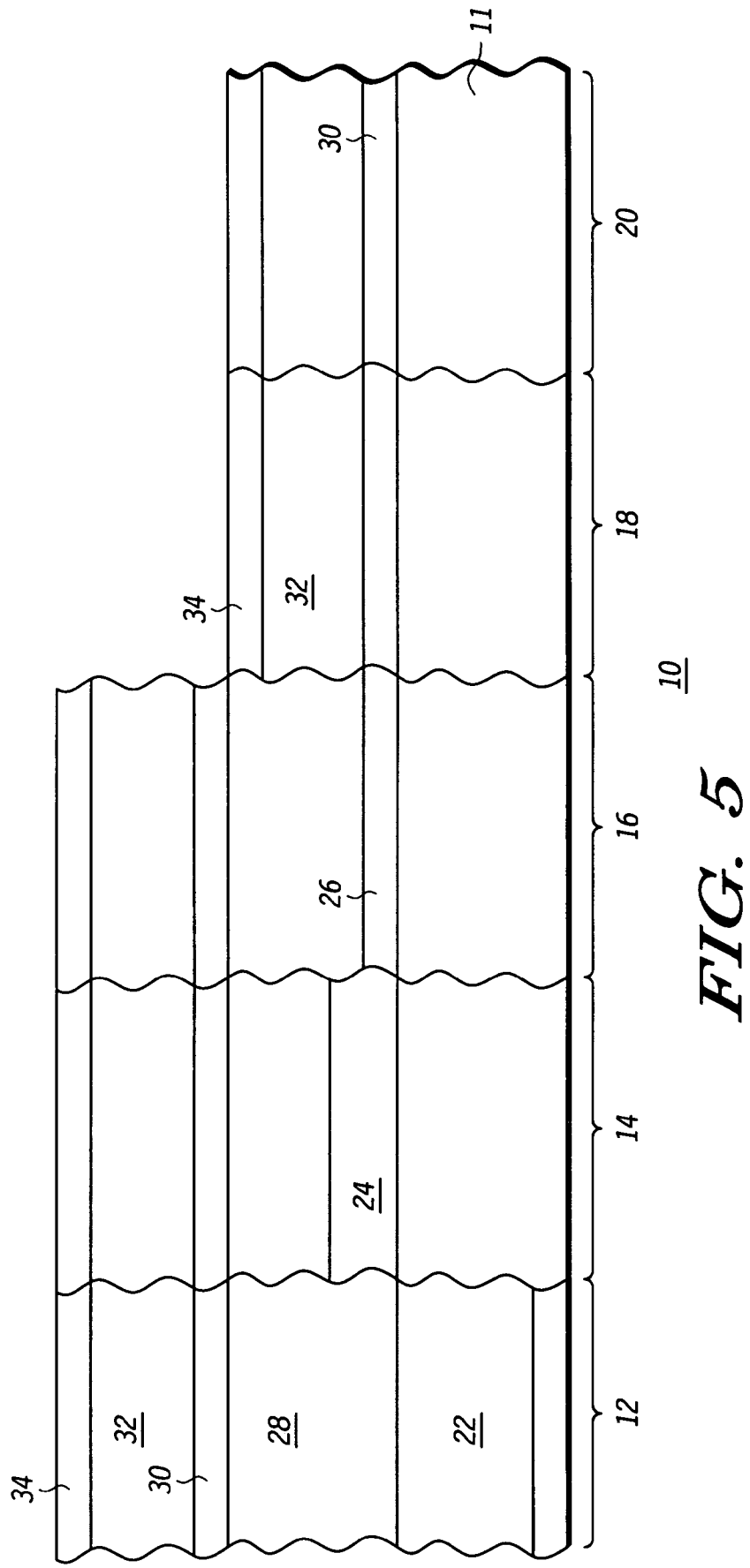
FIG. 5 illustrates the semiconductor device of FIG. 4 after forming a first electrode layer and a first protective layer in accordance with an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

FIG. 1 illustrates a cross-section of a semiconductor device 10 having a semiconductor substrate 11, a first dielectric layer 22 formed in the semiconductor substrate 11, and a second dielectric 24 formed over portions of the semiconductor substrate 11 in accordance with one embodiment of the present invention. In the embodiment illustrated, the semiconductor device 10 includes a passive device region 12, a first high voltage device region 14 and a second high voltage device region 16, a first core device region 18, and a second core device region 20. But all regions need not be present. In addition, the regions are illustrated close together only to aid in the understanding of the invention. Thus, the regions are drawn with squiggly lines between them to show that there may be areas that are not illustrated between each region. For example, field oxide regions for isolation are present between these regions.

Any passive devices, such as resistors, capacitors, diodes and the like, may be formed in the passive device region 12. As described herein, a resistor will be formed in the passive device region 12. In one embodiment, the first high voltage device region 14 is a dual gate oxide region (DGO) or a region where a capacitor is to be formed, and the second high voltage device region 16 is a thin gate oxide region or a region where a capacitor is to be formed. In the embodiment illustrated, an NMOS transistor will be formed in the first core device region 18 and a PMOS transistor will be formed in the second core device region 20. A skilled artisan, however, will recognize that the polarity of the core devices can be switched or both core device regions 18 and 20 can have the same polarities and that wells, although not shown, may be formed in the semiconductor substrate. For example, the first core device region 18 may have a p-well and the second device region 20 may have an n-well.

The semiconductor substrate 11 can be any semiconductor material or a combination of semiconductor materials, such as gallium arsenide, silicon germanium, silicon-on-insulator (SOI), strained silicon-on-insulator (SSOI), silicon, monocrystalline silicon, the like, and combinations of the above. The first dielectric region 22 may be a field isolation region, which in one embodiment is a trench region in the semiconductor substrate 11 that is filled with $SiO_2$. The second dielectric 24 is shown as being thermally grown over the high voltage regions 14 and 16 and the core device regions 18 and 20; in this embodiment, the second dielectric layer 24 may be silicon dioxide. If thermally grown, some oxide may be formed over the first dielectric layer 22, but since the amount of growth is much less than the amount of growth over the other regions, it is insignificant and thus, will be ignored. Alternatively, the second dielectric region 24 can be formed by other processes, such as chemical vapor deposition (CVD), atomic layer deposition (ALD), physical vapor deposition (PVD), the like, and combinations of the above. In one embodiment, the second dielectric layer 24 will serve as the dielectric for the DGO; the second dielectric layer 24 may have a thickness of approximately 50 Angstroms (5 nanometers). The second dielectric layer 24 is patterned using any method, such as forming a photoresist mask and etching away any exposed portions of the second dielectric layer 24.

After patterning the second dielectric layer 24, a third dielectric layer 26 is formed, as shown in FIG. 2. The third dielectric layer 26, in one embodiment, is a different material than the second dielectric layer 24; however, the same dielectric may be used. In one embodiment, the third dielectric layer 26 will serve as the gate dielectric for a TGO device. In this embodiment, the third dielectric layer 26 may be thermally grown $SiO_2$ with a thickness less than the thickness of the second dielectric layer 24, if the second dielectric layer 24 will be the gate dielectric for the DGO device. In one embodiment, the third dielectric layer 26 serving as a TGO is approximately 30 Angstroms (3 nanometers) in thickness. The third dielectric layer 26 may be formed by CVD, ALD, PVD, the like, and combinations of the above.

A cap 28 is formed over the semiconductor device 10 after the third dielectric layer 26 is formed, as shown in FIG. 3. A smoothening or planarization of the cap 28 can be applied. In one embodiment, the cap includes silicon, such as polysilicon. Alternatively, the cap 28 can be any conductive material, such as a metal or conductive oxide. In one embodiment, the cap 28 is approximately 100 to 500 Angstroms (10–50 nanometers) in thickness. The cap 28 can be formed by CVD, ALD, PVD, electroplating, electroless plating, the like, and combinations of the above. As will become apparent after further discussion of processing, the cap 28 will serve to protect the underlying dielectric layers when additional dielectric layers are formed. In one embodiment, the cap 28 prevents a high-k material from being formed over the first, second, and third dielectric layers 22, 24 and 26.

After forming the cap 28, a portion of the cap 28 is removed. The removal may occur by any process, such as wet or dry etching. If the cap 28 is a polysilicon, a dry etch using chlorine and fluorine based chemistry, such as $CF_4$, can be used. In one embodiment, the cap 28 is removed from the first and second core device regions 18 and 20. This may be desirable if the core device regions 18 and 20 are going to have the same gate dielectric material as each other but have a different dielectric material than the second dielectric 24 and the third dielectric layers 26.

After patterning the cap 28 in one embodiment, a fourth dielectric 30 is formed over the (remaining) cap 28 and the first and second core device regions 18 and 20, as illustrated in FIG. 4. In the embodiment illustrated in FIGS. 4–9, the first and second core device regions 18 and 20 will have the same material for the gate dielectrics; however, this is not required. In one embodiment, the fourth dielectric 30 is a dielectric material with a high dielectric constant (i.e., a high-k dielectric). A high dielectric constant is one that is greater than the dielectric constant of silicon dioxide, which is approximately 3.9, or in one embodiment, is greater than the dielectric constant of stoichiometric silicon nitride ($Si_3N_4$), which may be approximately 7.5. In one embodiment, the fourth dielectric 30 is a high-k dielectric. Suitable high-k dielectrics can be oxides of zirconium, hafnium, aluminum, lanthanum, strontium, tantalum, titanium, silicon and the combinations thereof may be used. Transition metal silicates and aluminates may also be used, such as hafnium silicate ($Hf_xSi_yO_z$) and hafnium aluminate ($Hf_xAl_yO_z$).

The fourth dielectric 30 can be formed by any process, such as CVD, ALD, PVD, thermal growth, the like, and combinations of the above. In addition, the fourth dielectric layer 30 can be a stack or combination of layers. Also, a native oxide (e.g., silicon dioxide) may be present between the fourth dielectric 30 and the semiconductor substrate 11 because a native oxide is often inherently formed when the semiconductor substrate 11 is exposed to an oxidizing environment. This is especially true if the semiconductor substrate 11 includes silicon. The fourth dielectric 30 may be any desirable thickness. In one embodiment, the fourth dielectric 30 has a thickness approximately equal to the thickness of the second dielectric layer 26. Although the fourth dielectric 30 is shown as only covering the top surfaces of the semiconductor device 10 in FIG. 4, it is a conformal layer. Since each region is actually separated from the others as indicated by the squiggly lines in the figures, the fourth dielectric 30 was not shown to be on the sidewall of the step between region 16 and 18 because this step may or may not be present or may be more gradual in reality. (This same rationale may be applied to other layers in the figures.)

In one embodiment, prior to forming the fourth dielectric 30 a semiconductor layer could be formed in either of the core device regions 18 or 20 or both. It may be desirable to form this semiconductor layer if the material interaction between the fourth dielectric 30 the material(s) in the semiconductor substrate 11 is undesirable. Thus, the material for this optional semiconductor layer can be chosen to improve the material interaction between it and the fourth dielectric 30. The semiconductor layer could be formed by any process, such as CVD, ALD, PVD, thermal growth, the like, and combinations of the above. This semiconductor material formed can be any semiconductor material or a combination of semiconductor materials, such as gallium arsenide, silicon germanium, silicon, monocrystalline silicon, and combinations of the above. This semiconductor material may be in-situ doped or undoped and may have a thickness between approximately 10 and 200 Angstroms (1–20 nanometers).

After the fourth dielectric 30 is formed, the gate electrodes for the first and second core device regions 18 and 20 may be formed. As shown in the figures, a dual-metal gate process will be described. However, the electrodes may be polysilicon or any suitable material formed by any process. A metal gate process will be described because a metal gate has advantages over polysilicon gates. For example, metal gates obviate gate-depletion and boron-penetration effects and provide a significantly lower sheet resistance than polysilicon gates.

A first electrode layer 32 and a first protective layer 34 are formed over the semiconductor substrate, as shown in FIG. 5. For bulk CMOS at gate lengths below 50 nanometers, gate metals with respective work functions within about 0.2 eV of the band edges (conduction and valence) of the material used for the semiconductor substrate 11 are desirable.

Accordingly, if the semiconductor substrate 11 is silicon the first electrode layer 32 may include rhenium, iridium, platinum, molybdenum, ruthenium, ruthenium oxide, the like, and combinations of the above for a PMOS device or include titanium, vanadium, zirconium, tantalum, aluminum, niobium, tantalum nitride, the like, and combinations of the above for an NMOS device. The first electrode layer 32 may be formed by any method such as CVD, ALD, PVD, electroplating, electroless plating, the like, and combinations of the above. In one embodiment, the first electrode layer 32 is approximately 50–1000 Angstroms (5–100 nanometers) thick.

The first protective layer 34 may be formed by CVD, ALD, PVD, the like or combinations of the above. In a preferred embodiment, the first protective layer 34 is a silicon oxide or silicon nitride hardmask. The protective layer 34 should be thick enough to serve as a hardmask and protect the underlying first electrode layer 32 when patterning the first electrode layer 32. In addition, the first protective layer 34 should be thin enough to be able to be removed efficiently after patterning the first electrode layer 32. The first protective layer 34 is used to pattern the first electrode layer 32 because many suitable metal etches used to pattern the first electrode layer 32, if it is a metal, will also etch or degrade a photoresist mask. Therefore, a mask which can sufficiently withstand the metal etch, such as the first protective layer 34, is needed. The first protective layer 34 can be patterned using a photoresist mask and an etch process (e.g., dry or wet etching). The first protective layer 34 is removed in areas where the first electrode layer 32 will be removed.

Figure 6:
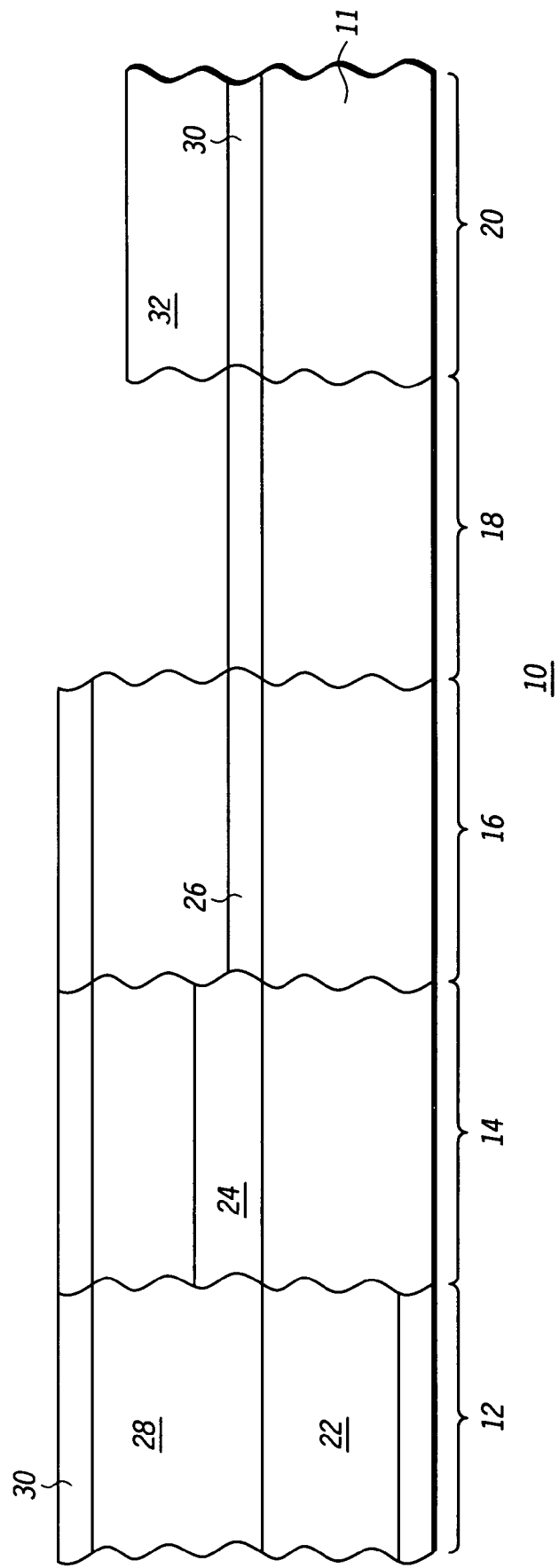
FIG. 6 illustrates the semiconductor device of FIG. 5 after patterning the first electrode layer in accordance with an embodiment of the present invention.

After patterning the first protective layer 34, the first electrode layer 32 is patterned using the first protective layer 34 as a hardmask. In one embodiment, the first electrode layer 32 is patterned using a wet etch with a solution of sulphuric acid, hydrogen peroxide and water. Any remaining portions of the first protective layer 34 are then removed; in some embodiments, using a dry or wet etch. The resulting structure forms only the first electrode layer 32 over only the second core device region 20, as shown in FIG. 6.

Figure 7:
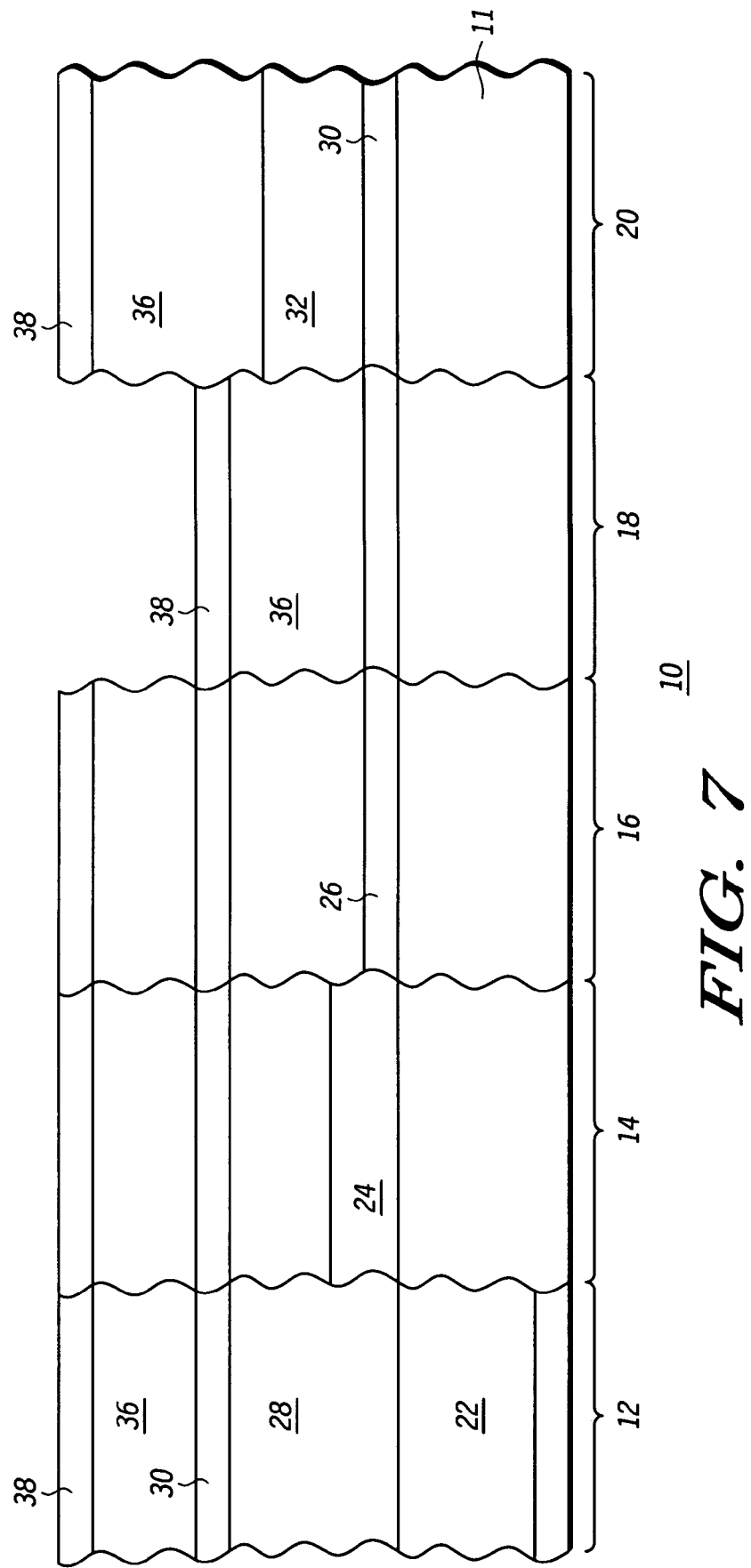
FIG. 7 illustrates the semiconductor device of FIG. 6 after forming a second electrode layer in accordance with an embodiment of the present invention.

After forming and patterning the first electrode layer 32, a second electrode layer 36 and a second protective layer 38 are formed. The second electrode layer 36 may be any of the same materials and formed by any of the same processes as the first electrode layer 32. But the second electrode layer 36 is probably chosen for a device having a different conductivity than the first electrode layer 32. Thus, if the first electrode layer 32 is an electrode for a PMOS device, then the second electrode layer 36 may be an electrode for an NMOS device. In a preferred embodiment, the first electrode layer 32 is a P-type metal and the second electrode layer 36 is an N-type metal. The second protective layer 38 may the same as first protective layer 36 and may be formed to the same thickness by the same processes; although, this is not necessary. The patterning of the second electrode layer 36 and the second protective layer 38 is the same as the first electrode layer 32 and the first protective layer 34 with the only difference being that the second electrode layer 36 will remain in both the first core device region 18 and the second core device region 20. (The first electrode layer 32 only remained in the second core device region 20.) Thus, the second electrode layer 36 is formed over the fourth dielectric 30 in both the first and second core device regions 18 and 20. In addition, the second electrode layer 36 is formed over the first electrode layer 32 in the second core device region 20, as shown in FIG. 7.

Figure 8:
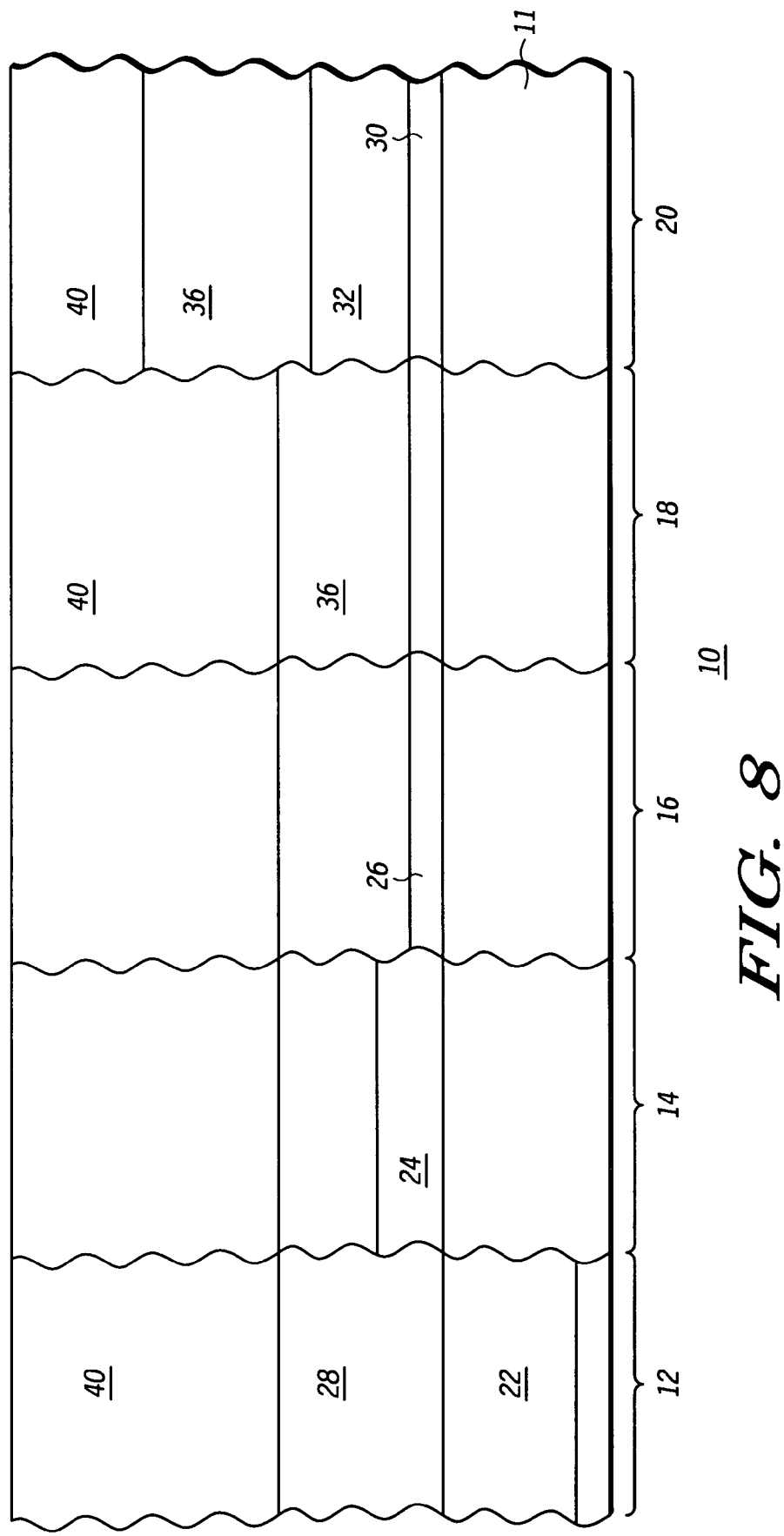
FIG. 8 illustrates the semiconductor device of FIG. 6 after patterning the second electrode layer and forming a third electrode layer in accordance with an embodiment of the present invention.

After the second electrode layer 36 is patterned, the portions of the fourth dielectric 30 that are over the cap 28 are removed and a third electrode layer 40 is formed over all the regions, as shown in FIG. 8. The fourth dielectric layer 30 can be removed using an etch process, such as a dry or wet etch. The cap 28 protects the underlying layers and prevented the fourth dielectric layer 30 from being formed on any underlying layers from where it would be difficult to remove the fourth dielectric layer 30.

The third electrode layer 40 can be formed by any process, such as CVD, ALD, PVD, electroplating, electroless plating, the like, and combinations of the above. In a preferred embodiment, the third electrode layer 40 a silicon containing layer which is either deposited as a conductive material or is subsequently made conductive. In a preferred embodiment, the third electrode layer 40 is a polysilicon layer or a polysilicon-germanium layer which is either in-situ doped or subsequently doped to be sufficiently conductive. The third electrode layer 40 may be a doped or undoped amorphous silicon or silicon-germanium layer. It is preferred that the third electrode layer 40 is silicon containing so that in the high voltage regions 14 and 16, a dielectric other than a high-k dielectric can be used and a silicon containing electrode will be formed avoiding problems that may be created with a high-k dielectric or a metal electrode in a high voltage application. However, the third electrode layer 40 could be a metal. The third electrode layer 40 may have a thickness of approximately 100–1500 Angstroms (10–150 nanometers). A smoothening or planarization of the layer 40 can be applied for well controlled patterning of the layer if required.

Figure 9:
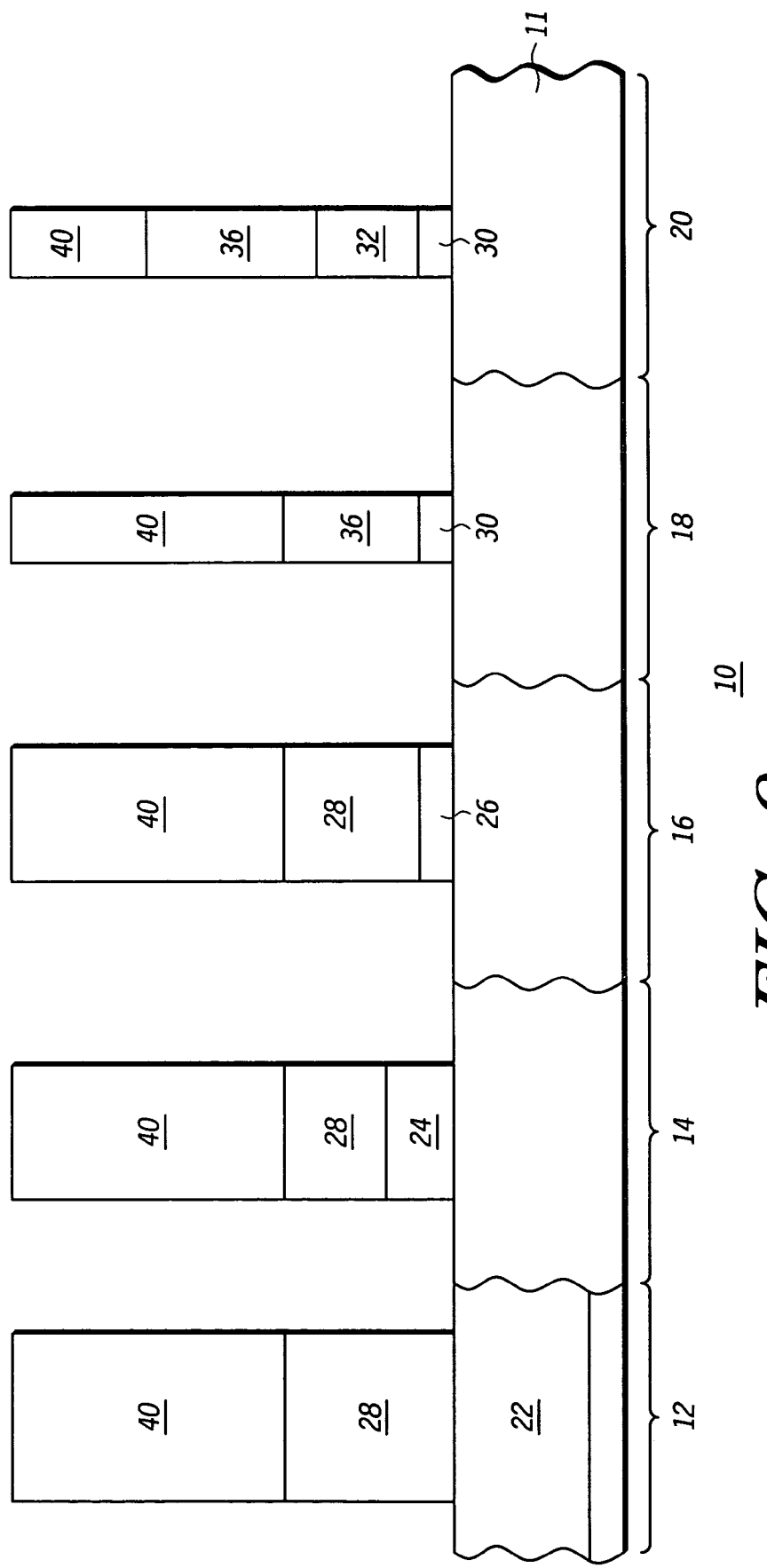
FIG. 9 illustrates the semiconductor device of FIG. 8 after patterning to form a passive device structure, high voltage device structures, and core device structures in accordance with an embodiment of the present invention.

After forming the third electrode layer 40, all layers formed over the semiconductor substrate 11 are patterned, as shown in FIG. 9. Separate patterning for core devices from other devices may be performed to enable better control during patterning. In the passive device region 12, the third electrode layer 40 and the cap 28 are patterned to form a resistor over the first dielectric layer 22. In the first high voltage device region 14, the second dielectric layer 24, the cap 28, and the third electrode layer 40 are patterned to form a DGO stack. In the second high voltage device region 16, the third dielectric layer 26, the cap 28, and the third electrode layer 40 are patterned to form a TGO stack. In the first core device region 18, the third dielectric layer 30, the second electrode layer 36 and the third electrode layer 40 are patterned to form a PMOS stack. In the second core device region 20, the third dielectric layer 30, the first electrode layer 32, the second electrode layer 36 and the third electrode layer 40 are patterned to form an NMOS stack. Conventional techniques may be used. To form the devices in each of the regions, additional known processing is performed, such as doping portions of the semiconductor substrate 11 are doped to form source and drain regions.

Figure 10:
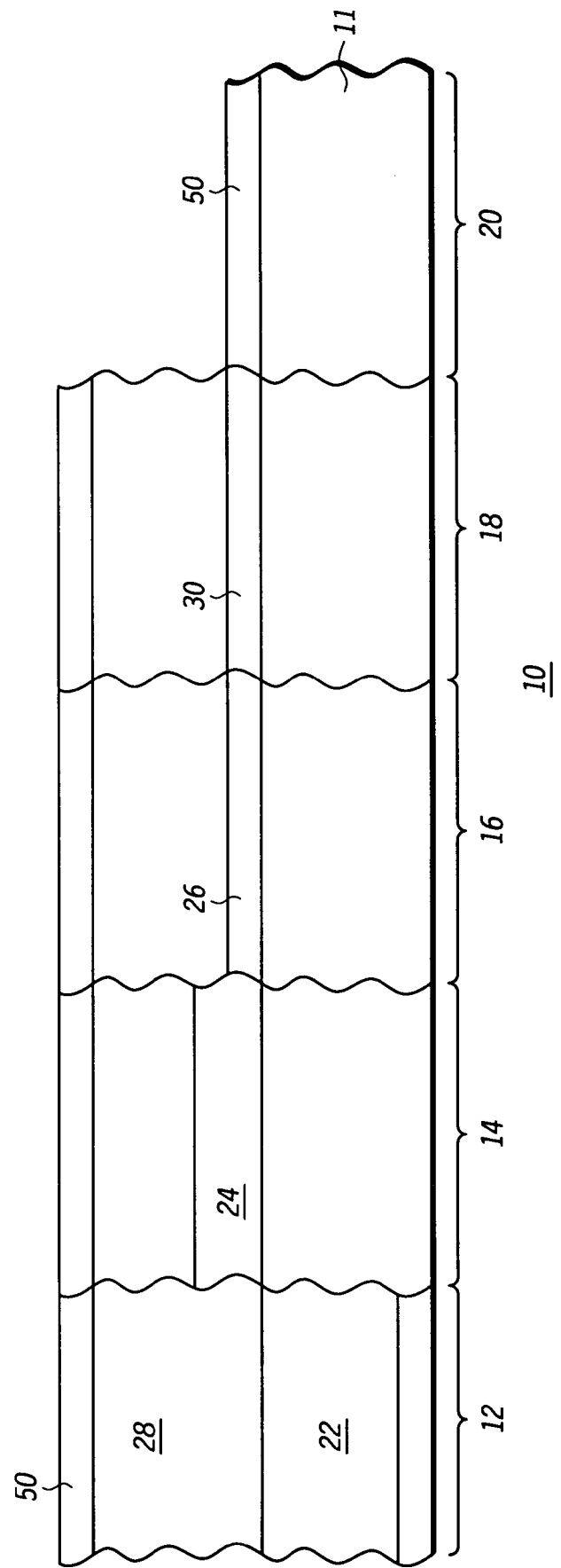
FIG. 10 illustrates the semiconductor device of FIG. 3 after forming a fifth dielectric layer in accordance with another embodiment of the present invention.

Illustrated in FIG. 10 is an alternate embodiment where the first and second core device regions have different dielectric layers. In this embodiment, the fourth dielectric 30 is formed before the cap 28 is formed. After forming the fourth dielectric 30, the cap 28 is formed as previously discussed. Since the fourth dielectric layer 30 is already formed in the first core device region 18, the cap 28 is patterned so that it remains over all regions except the second core device region 20. After patterning the cap 28, a fifth dielectric layer 50 is formed in the second core device region 20 and over the cap 28. In one embodiment, a semiconductor layer is formed in the device region 20 prior to forming the fifth dielectric layer 50 in the second core device region 20 and over the cap 28. The semiconductor layer formed here may be similar to the semiconductor layer that, in one embodiment, is formed before the fourth dielectric layer 30. Processing continues as discussed in regards to FIGS. 5–9. The difference is that in all the figures the first core device region 18 has a different dielectric layer than the second core device region 20, cap 28 is present in the first core device region 18 and the fifth dielectric layer 50 is present over the cap 28 until it is removed. The fifth dielectric layer 50 removed in a similar fashion and at the same time as the fourth dielectric layer 30 between FIGS. 7 and 8. Since in the embodiment shown in FIG. 10 the cap 28 is formed over the fourth dielectric 30, it is desirable that the cap 28 is a material that is a suitable gate electrode material for the first core device region 18. Thus, the cap 28 may be a metal gate material that is appropriate for the conductivity of the device being formed or may be polysilicon doped to the appropriate conductivity for the device being formed.

By now it should be appreciated that there has been provided an integration for forming high voltage devices on the same semiconductor device as core devices, where the high voltage devices and core devices have different (gate) dielectrics and electrodes. Thus, multiple voltage devices can be formed on the same semiconductor substrate. Existing DGO/TGO device technology can be reused with metal gate/metal oxide technology. Also reliable DGO/TGO device characteristics can be achieved. Furthermore, the integration can be used to build metal-gate/metal oxide NMOS devices with $SiO_2$ PMOS devices in CMOS applications. For example, the embodiment in FIG. 10 can be used while eliminating the presence of the passive device region 12, and the first and second high voltage device regions 14 and 18. As discussed, this integration can be used with (poly) resistors and (decoupling) capacitors. In the foregoing specification, the invention has been described with reference to specific embodiments. However, one of ordinary skill in the art appreciates that various modifications and changes can be made without departing from the scope of the present invention as set forth in the claims below. For example, different materials may be used. Accordingly, the specification and figures are to be regarded in an illustrative rather than a restrictive sense, and all such modifications are intended to be included within the scope of the present invention.

Although the invention has been described with respect to specific conductivity types or polarity of potentials, skilled artisans appreciate that conductivity types and polarities of potentials may be reversed. Moreover, the terms "front", "back", top, "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for forming a semiconductor device comprising:
   providing a semiconductor substrate having a first portion and a second portion;
   forming a first dielectric layer over the first portion of the semiconductor substrate;
   forming a second dielectric layer over the second portion of the semiconductor substrate;
   forming a cap over the first dielectric;
   forming a first gate electrode layer over the cap; and
   forming a second gate electrode layer over the second dielectric layer, but not over the first gate electrode layer.

2. The method of claim 1, wherein forming the first dielectric layer and forming the second dielectric layer comprise forming different dielectric materials.

3. The method of claim 1, wherein forming the first dielectric layer and forming the second dielectric layer comprise forming the same dielectric material.

4. The method of claim 1, wherein the forming the first dielectric layer comprises forming a field oxide.

5. The method of claim 1, wherein forming the first dielectric layer comprises forming a gate dielectric.

6. The method of claim 1, wherein forming the second dielectric layer comprises forming a dielectric layer with a high dielectric constant.

7. The method of claim 1, wherein forming the second dielectric layer comprises forming a stack of at least two dielectric layers, wherein at least one of the at least two dielectric layers has a dielectric constant greater than approximately 4.

8. The method of claim 1, wherein forming the cap comprises forming a polysilicon cap.

9. The method of claim 1, wherein
   the semiconductor substrate further comprises a third portion; and
   the method further comprises:
   forming a third dielectric layer over the third portion;
   forming the second gate electrode layer over the third dielectric layer; and
   forming a third gate electrode layer over the second gate electrode layer.

10. The method of claim 9, wherein forming the third dielectric layer and forming the second dielectric layer comprise forming the same dielectric material.

11. The method of claim 9, wherein forming the third dielectric layer and forming the second dielectric layer comprise forming different dielectric materials.

12. The method of claim 1, wherein
   the semiconductor substrate further comprises a fourth portion; and
   the method further comprises:
   forming an isolation region in the fourth portion;
   forming the cap over the fourth portion; and
   forming the second gate electrode layer over the cap.

13. A method for forming a semiconductor device comprising:
   providing a semiconductor substrate having a first portion and a second portion;
   forming a first dielectric over the first portion of the semiconductor substrate, wherein the first dielectric has a high dielectric constant;

forming a second dielectric over the second portion of the semiconductor substrate;

forming a cap over the second dielectric, wherein the cap comprises silicon;

forming a first gate electrode over the first dielectric, wherein the first gate electrode comprises metal; and forming a second gate electrode over the cap but not over the first gate electrode, wherein the second gate electrode comprises silicon.

14. The method of claim 13, wherein forming the first dielectric and forming the second dielectric comprise forming different dielectric materials.

15. The method of claim 13, wherein forming the first dielectric and forming the second dielectric comprise forming the same dielectric material.

16. The method of claim 13, wherein forming the first dielectric comprises forming a gate dielectric.

17. The method of claim 13, wherein forming the first dielectric, wherein the first dielectric has the high dielectric constant comprise forming the first dielectric, wherein the first dielectric has a dielectric constant greater than approximately 4.

18. A semiconductor device comprising:

a semiconductor substrate comprising a first portion and a second portion;

a first dielectric layer over the first portion;

a cap over the first dielectric layer;

a first gate electrode layer over the cap;

a second dielectric layer over the second portion; and a second gate electrode layer over the second dielectric layer wherein the first gate electrode layer and the second gate electrode layer do not overlie each other.

19. The semiconductor device of claim 18, wherein the cap comprises polysilicon;

the first gate electrode layer is different than the second gate electrode layer; and and the first dielectric layer is different than the second dielectric layer.

20. The semiconductor device of claim 19, wherein the second dielectric layer has a dielectric constant greater than approximately 4.

21. The method of claim 13, wherein:

the forming the first gate electrode further comprises forming the first gate electrode after forming the cap; and the forming the second gate electrode further comprises forming the second gate electrode after forming the first gate electrode.

* * * * *